United States Patent [19]
Kuenstner

[11] Patent Number: 5,685,300
[45] Date of Patent: Nov. 11, 1997

[54] NONINVASIVE AND IN-VITRO MEASUREMENT OF GLUCOSE AND CHOLESTEROL BY NUCLEAR MAGNETIC RESONANCE SPECTROSCOPY

[76] Inventor: J. Todd Kuenstner, 26 Wild Duck Rd., Wyckoff, N.J. 07481

[21] Appl. No.: 401,828

[22] Filed: Mar. 10, 1995

Related U.S. Application Data

[63] Continuation-in-part of Ser. No. 221,611, Apr. 1, 1994, abandoned.

[51] Int. Cl.$^6$ ................................. A61B 5/0555
[52] U.S. Cl. .................. 128/632; 128/653.2; 436/71; 436/74; 436/95; 436/173
[58] Field of Search .................. 128/632, 653.2, 128/653.3; 324/307, 308, 309, 312, 71, 74; 436/79, 95, 108, 173

[56] References Cited

U.S. PATENT DOCUMENTS

| | | | |
|---|---|---|---|
| 4,878,021 | 10/1989 | Granot | 324/309 |
| 4,915,111 | 4/1990 | Sano et al. | 128/653.3 |
| 5,072,732 | 12/1991 | Rapoport et al. | 128/653.2 |
| 5,261,405 | 11/1993 | Fossel | 128/653.2 |

Primary Examiner—Ruth S. Smith
Attorney, Agent, or Firm—Charles W. Calkins; Kilpatrick Stockton LLP

[57] ABSTRACT

A method of noninvasive and in-vitro glucose and cholesterol concentration measurement employing nuclear magnetic resonance (NMR) spectroscopy is described. The measurement comprises a ratio formed by dividing the area of the resonance of the desired analyte, e.g., glucose or cholesterol, by the area of the water resonance in a spectrum of blood or tissue. In the in-vivo setting, the spectrum is obtained either in linkage with the pulsation of blood or by using a slice selection gradient such as that employed in the magnetic resonance imager. This measurement is then correlated to a traditional serum analyte concentration.

15 Claims, 8 Drawing Sheets

NONINVASIVE AND IN-VITRO MEASUREMENT OF GLUCOSE AND CHOLESTEROL BY NUCLEAR MAGNETIC RESONANCE SPECTROSCOPY

This application is a continuation-in-part of U.S. patent application Ser. No. 08/221,611 filed Apr. 1, 1994 now abandoned.

FIELD OF THE INVENTION

The present invention relates to methods of noninvasive (in-vivo) and in-vitro glucose and cholesterol concentration measurement employing nuclear magnetic resonance (NMR) spectroscopy. In the in-vivo setting, the NMR measurement is linked to the pulsation of blood in tissue or alternatively is obtained using a slice-selection gradient similar to that used in magnetic resonance imaging.

BACKGROUND OF THE INVENTION

In the past decade, there has been intense world-wide interest in a noninvasive glucose concentration measurement. Most workers in this field have focussed their efforts in the near-infrared region of the electromagnetic spectrum because of the relative penetrability of tissue by radiation in this region and because the associated technology could be relatively easily adapted to an instrument for home use for the diabetic population.

Futrex, Inc. of Gaithersburg, Md., is currently marketing an instrument for noninvasive glucose measurements for research use. Apparently, the Food and Drug Administration has not approved this instrument for clinical use. It is notable that there are no reports in the literature of near-infrared measurements of glucose in tissue or even in whole blood which can accurately predict the glucose concentration in an unknown tissue or blood sample.

All of this evidence suggests that near-infrared spectroscopy may not be the best technology to accurately measure glucose in tissue or blood. In contrast, hemoglobin concentration may be measured very accurately in whole blood in the near-infrared region as described in my U.S. Pat. No. 5,377,674, filed Jan. 13, 1994 entitled "Method for Non-Invasive and In-vitro Hemoglobin Concentration Measurement", the disclosure of which is hereby incorporated herein by reference.

Recognizing that near-infrared spectroscopy may not be the best technology for the purpose of noninvasive glucose testing, my research efforts have turned to other spectroscopic methods, including nuclear magnetic resonance spectroscopy. In 1982, in *Clinical Chemistry*, J. Bock reported the results of analysis of serum by high field proton nuclear magnetic resonance. In this study, he noted the presence of glucose resonances in the vicinity of 3 to 4 ppm and at circa 5.5 ppm and a large resonance due to water at 5 ppm. This juxtaposition of resonances due to water and glucose suggests to me the possibility of a glucose concentration measurement in more complex media such as whole blood or tissue comprising a ratio of the areas of the resonances due to glucose and water.

In the article by J. Bock, cited above, a measurement of glucose concentration in serum using NMR spectroscopy is not disclosed or suggested. Quantitative determinations have now been descried for glucose in blood plasma in an in-vitro setting using WATR-CPMG (Water Attenuation by $T_2$ Relaxation—Carr-Purcell-Meiboom-Gill) 1H (proton) NMR Spectroscopy and a magnetic field strength of 250 MHz (megahertz). See, S. Fan, W. Y. Choy, S. L. Lam and S. C. F. Au-Yeung, *Analytical Chemistry*, vol. 64, 1992, pp. 2570–2574.

A glucose measurement which employs resonance ratios has more recently been described by J. Bock in a study of amniotic fluid (*Clinical Chemistry*, vol. 40, no. 1, 1994, pp. 56–61). However, in contrast to the methods of the present invention described below, the reference resonance disclosed by J. Bock consisted of a citrate quartet rather than a water resonance and the test medium was a clear fluid which is a more traditional medium for NMR analysis than either blood or tissue.

In addition to studying body fluids, NMR spectroscopists have obtained 1H NMR spectra of a rat leg in-vivo using Carr-Purcell-Meiboom-Gill (CPMG) spin-echo sequences of duration 270 msec (milliseconds) and 540 msec with a magnetic field strength of 360 MHz. See, S. R. Williams, D. G. Gadian, E. Proctor, D. B. Sprague and D. F. Talbot, *Journal of Magnetic Resonance*, vol. 63, 1985, pp. 406–412. In this study, a home-built probe which surrounded the rat leg was used. Based on differences in spin-spin relaxation, T2, between water and various metabolites, the resonance of water in the tissue was suppressed but not eliminated and the resonances of metabolites were not greatly distorted.

SUMMARY OF THE INVENTION

According to the method of the present invention, the concentration of glucose, cholesterol and other analytes may be measured in-vivo or alternatively, in-vitro in a serum, plasma or blood sample. In general terms, the concentration of the desired analyte is obtained by taking an NMR spectrum of the sample which is tissue in the in-vivo setting and which is either serum, plasma or blood in the in-vitro setting. The NMR spectrum includes an analyte resonance and a reference resonance. The reference resonance is a water resonance. Next, a ratio of the area of the analyte and reference resonances is formed and this ratio is correlated with reference data to obtain the concentration measurement.

Using the NMR signals obtained in either the in-vivo or in-vitro settings, the resonance due to glucose, cholesterol or another desired analyte may be either directly compared to the resonance due to water or indirectly compared to the resonance due to water by way of a "bridge" such as the high-field aliphatic proton resonance. The resonance due to water serves as both a reference point for chemical shift and a reference guage by which to compare the size of the glucose resonance. The relative size of the glucose resonance corresponds to the glucose concentration in the medium.

In a preferred embodiment, an NMR spectrum of tissue is also obtained at the trough of blood pulsation into a given volume of tissue and is subtracted from an NMR spectrum of tissue in the same volume of tissue obtained at the peak of blood pulsation. In this fashion, a spectrum due to arterial blood only is obtained. Alternatively, a slice selection gradient of a magnetic resonance imager is used to localize the tissue to be analyzed. Tissues which are suitable for concentration analysis, include but are not limited to, large blood vessels such as the inferior vena cava, aorta or neck veins, pulmonary tissue, contents of the heart chambers and the capillary bed tissue of a finger.

Validation of the measurement would be achieved by a correlation study in a large population which would compare the NMR resonance ratio to the serum analyte concentration (for example, glucose and cholesterol) of each subject in the population.

An advantage of the in-vivo analyte concentration measurement of the present invention is that there is no pain from performing this procedure on the subject. Other advantages include that, there is no release of blood or other body fluids which are potentially infectious, the time to transport a sample and analyze it at the laboratory are reduced and the overhead and reagent costs incurred by the laboratory are reduced.

The methods of the present invention may also be utilized in-vitro. In the in-vitro setting, a small volume of serum, plasma, blood or other body fluid may be analyzed in an NMR tube. Advantages of this method of measurement in the in-vitro setting using whole blood, include the elimination of the need to separate blood into serum and red cells prior to analysis. The separation step takes from 30 to 40 minutes considering that samples require 20 to 30 minutes to clot and then 10 minutes for centrifugation. Furthermore, a single sample would be analyzed concurrently for multiple analytes. Finally, there are no reagent costs associated with this method.

DETAILED DESCRIPTION OF THE INVENTION

Figure 1:
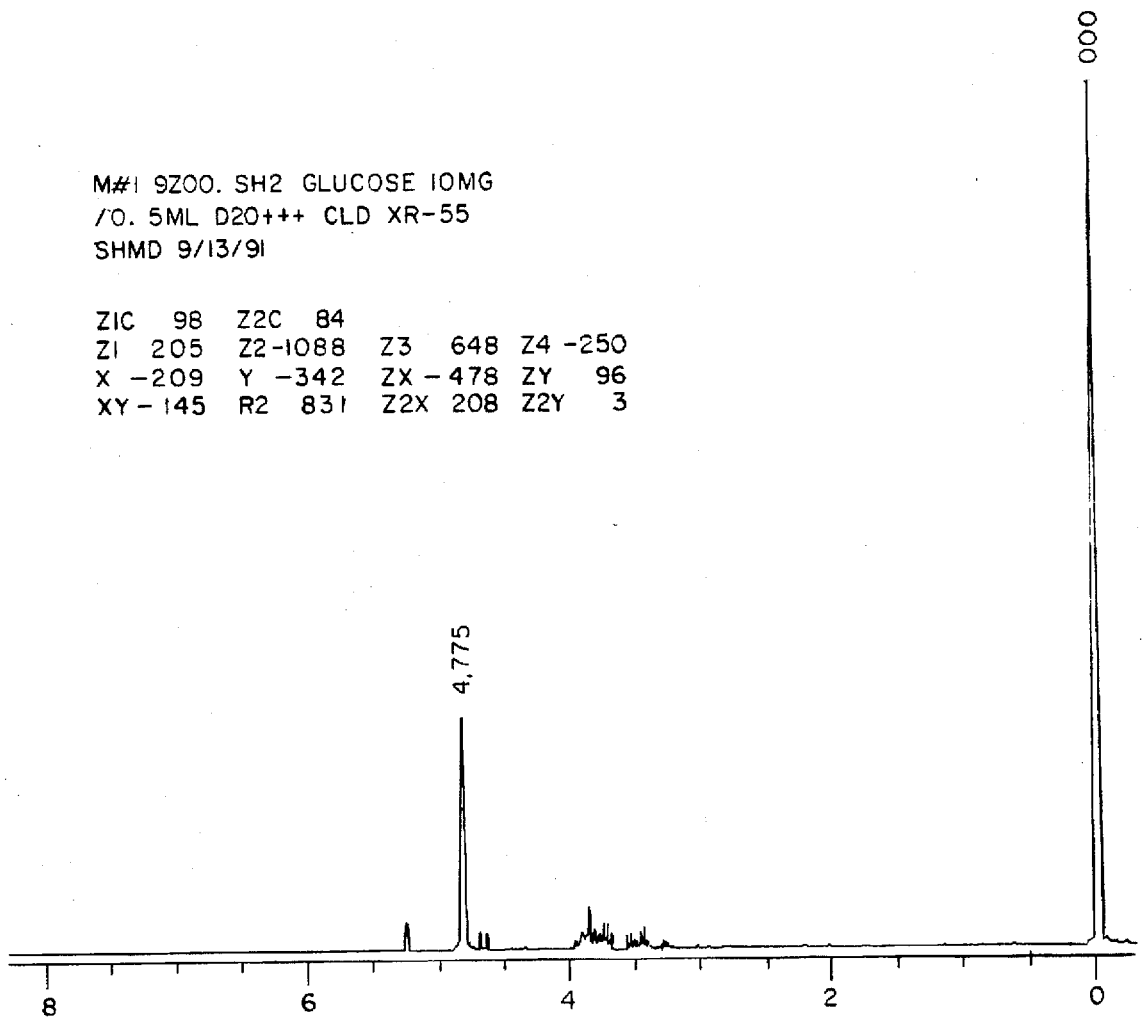
FIG. 1 shows a proton NMR spectrum of pure glucose in $D_2O$ (deuterated water).

According to the present invention, a method for determining the concentration of an analyte in-vivo comprises the following steps:

a. obtaining an NMR spectrum at a plurality of resonances from capillary bed tissue, said plurality of resonances including at least one analyte resonance and at least one reference resonance; and b. correlating the ratio of these resonances with reference data to determine the concentration of the analyte.

Similarly, a method for determining the concentration of an analyte in a blood sample (in-vitro) comprises:

a. obtaining an NMR spectrum at a plurality of resonances from the blood sample said plurality of resonances including at least one analyte resonance and at least one reference resonance; and b. correlating the ratio of these resonances with reference data to determine the concentration of the analyte.

The methods of the present invention may be advantageously utilized to determine the concentration of a variety of analytes including, but not limited to: glucose and cholesterol.

NMR offers the possibility of measurement of several other analytes in addition to glucose and cholesterol. Shapiro and Chan demonstrated concentrations of phosphorus metabolites in-vivo using the proton concentration as an internal standard (J. I. Shapiro and L. Chan, *Journal of Magnetic Resonance*, vol. 75, 1987, pp. 125–128.) Using a similar approach, i.e., comparing the sodium resonance to the proton resonance of water using both 23 Na and proton NMR spectroscopy in tandem, it may be possible to measure whole blood sodium concentration. Phosphorus NMR spectroscopy has also been used to measure pH and magnesium concentration in tissue and whole blood concentrations of these analytes will probably be measured non-invasively in the future.

In the in-vivo setting, in a preferred embodiment a proton NMR spectrum is obtained in linkage with the pulsation of blood in tissue and a subtraction of the peak and trough spectra is performed in order to isolate the spectrum which is due to arterial blood only. In this embodiment the method of the present invention comprises:

obtaining an NMR spectrum, at a plurality of resonances, from capillary bed tissue during the peak of a blood pulsation through the tissue, said plurality of resonances including:

at least one analyte resonance and at least one reference resonance;

obtaining an NMR spectrum at said plurality of resonances from said capillary bed tissue during the trough of a blood pulsation through the tissue;

subtracting the NMR spectrum at the trough of the blood pulsation from the NMR spectrum at the peak of the blood pulsation to obtain an NMR spectrum due to arterial blood; and comparing the NMR spectrum due to arterial blood to a reference curve which is generated by a correlation study to determine the concentration of the analyte in the tissue.

The pulsation of blood in tissue has found great utility in pulse oximetry. In pulse oximetry, by obtaining measurements at the peak and trough of blood pulsation in tissue, one may separate the absorbance of arterial blood from the absorbance of the remaining tissue. The use of pulsation for the purposes of hemoglobin saturation monitoring, i.e., determining the amount of hemoglobin which is oxygenated, is now well known and widely used in emergency rooms, operating rooms and intensive care units. The use of pulsation for purposes of determination of hemoglobin concentration is described in my U.S. Pat. No. 5,377,674, and in my co-pending patent application, entitled "Method For Noninvasive (In-Vivo) And In-vitro Total Hemoglobin, Oxyhemoglobin, Deoxyhemoglobin, Carboxyhemoglobin And Methemoglobin Concentration Determination" filed the same day as the present application.

NMR spectroscopists who perform in-vivo studies have noted the pulsation of blood in tissue and use it for "gating" purposes. Prior to my invention, this phenomenon has not been exploited for the purpose of in-vivo metabolite concentration measurements by NMR. As explained below, blood pulsation is potentially useful for the purpose of determination of blood glucose by NMR spectroscopy.

If one were to measure the concentration of glucose noninvasively using the fingertip, at the peak of blood pulsation, the volume of blood in the fingertip tissue which is within the magnetic field will be highest. At the trough of blood pulsation, the volume of blood will be lowest. By subtracting the water resonance and the glucose resonance at the trough from the water resonance and the glucose resonance at the peak, one may obtain water and glucose resonances due to arterial blood only. This ratio of glucose to water resonances present in arterial blood will generally correspond to a traditional blood glucose measurement.

The pulsing sequences used in NMR are much longer than those used in pulse oximetry. In pulse oximetry, light is flashed 480 times per second across the vascular bed and there are approximately 60 to 90 cardiac cycles per minute in the average person. Assuming a heart rate of 60 cardiac cycles per minute, the pulse oximeter will make 480 pulses per cardiac cycle. In NMR, If one used a CPMG pulsing sequence of 100 msec separated by 1.7 seconds resembling the experimental conditions in the study by S. R. Williams et. al., one-tenth of the time of an average pulsation (100 msec out of one second per pulsation) would be required for a single pulsing sequence. In order to localize the timing of peak and trough, the measurement would best be made in conjunction with a pulse oximetric measurement using a single wavelength such as 940 nm. Alternatively, it could be made in tandem with a noninvasive hemoglobin concentration measurement.

Based on the above timing considerations, spectra could be obtained using CPMG pulsing sequences of 100 msec and then by averaging a difference spectrum from every third cardiac cycle. Numerous difference spectra averaged over many cardiac cycles would improve the accuracy of the measurement. Increasing the digitisation of the spectrometer would facilitate measurement of glucose and other metabolites and offers the possibility of decreasing the CPMG pulsing sequence from 100 msec to a shorter time period.

Alternatively, in the in-vivo setting, in the preferred embodiment, slice-selection gradients similar to those used in the magnetic resonance imagers, may be used to study a desired plane of tissue. For clinical analyte concentration measurement the following organs and tissues are useful: heart, lung, large abdominal or neck blood vessels and capillary bed tissue of the finger. If a radiofrequency pulse of a specific frequency is applied while the slice selection gradient is activated, only nuclei in the plane corresponding to the frequency resonate. In this fashion a desired tissue may be studied.

As set forth above, the methods of the present invention utilize reference data to correlate the NMR data obtained from the capillary bed tissue (in-vivo), or blood sample (in-vitro) to the concentration of the analyte being measured. Generation of suitable reference data is well within the skill of those of ordinary skill in the art. In general, reference data may be gathered, and a reference curve, or the like, generated by performing the method of the present invention on blood samples having known concentrations of the analyte to be measured. The NMR data obtained by the method of the present invention may then be directly correlated to a known concentration of the analyte to generate a reference curve for future use. In the in-vivo embodiment, a reference curve is preferably generated by comparing and correlating the NMR data obtained by the method of the present invention to the concentration of the analyte obtained by a traditional invasive method to generate a reference curve. Preferably, the reference data and correlation data are stored electronically in the device utilized to take the NMR spectrum and the resonances obtained and immediately and directly compared to the reference data to provide the concentration of the analyte.

The features and advantages of the methods of the present invention will be further appreciated with reference to the following example.

EXAMPLE

This example illustrates NMR analysis of blood samples.

Figure 2:
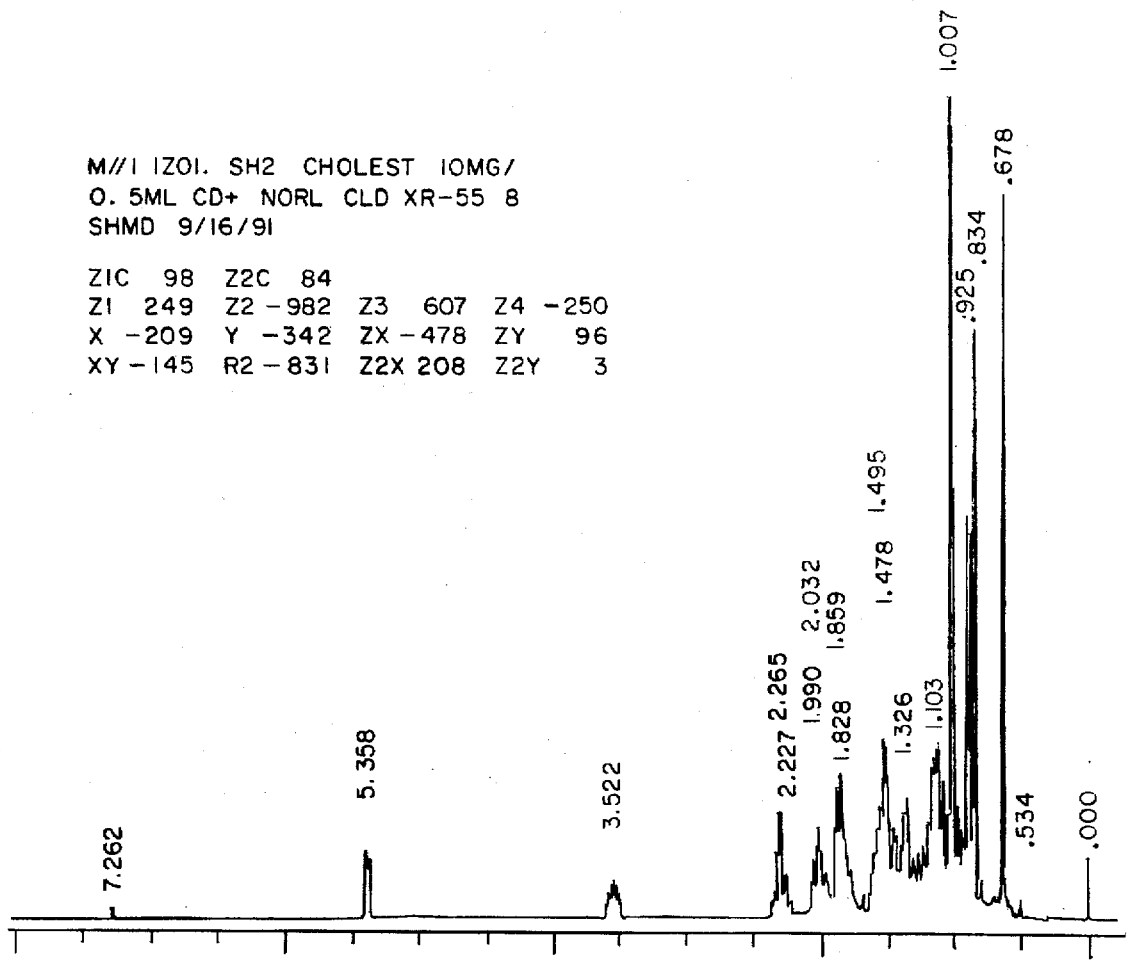
FIG. 2 shows a proton NMR spectrum of pure cholesterol in $D_2O$

For proton NMR analysis of the pure compounds, spectroscopic grade glucose and cholesterol were used. Separate solutions of each compound consisting of 10 mg in 0.5 ml of $D_2O$ with tetramethylsilane (TMS) as a reference were prepared. The samples were analyzed in 5 mm-diameter glass NMR tubes (Aldrich Chemical Co., Milwaukee, Wis.). Spectra were obtained at 300 MHz with a General Electric QE Plus NMR spectrometer (General Electric Co., Schenectady, N.Y.). Thirty two scans were summed for each spectrum. The resulting spectra of glucose and cholesterol are shown in FIGS. 1 and 2 respectively.

The aqueous glucose solution and the unconventional samples of unlysed whole blood and of cadaveric pulmonary tissue were also analyzed in 5 mm diameter glass NMR tubes (Aldrich Chemical Co.). However, with these samples, spectra were obtained using an AMX 500 MHz spectrometer (Bruker Instruments, Billerica, Mass.). Sixteen scans were summed for each spectrum. To obtain the spectrum of pulmonary tissue, thin slivers of tissue were cut and the tissue was stuffed into the NMR tube.

Figure 3:
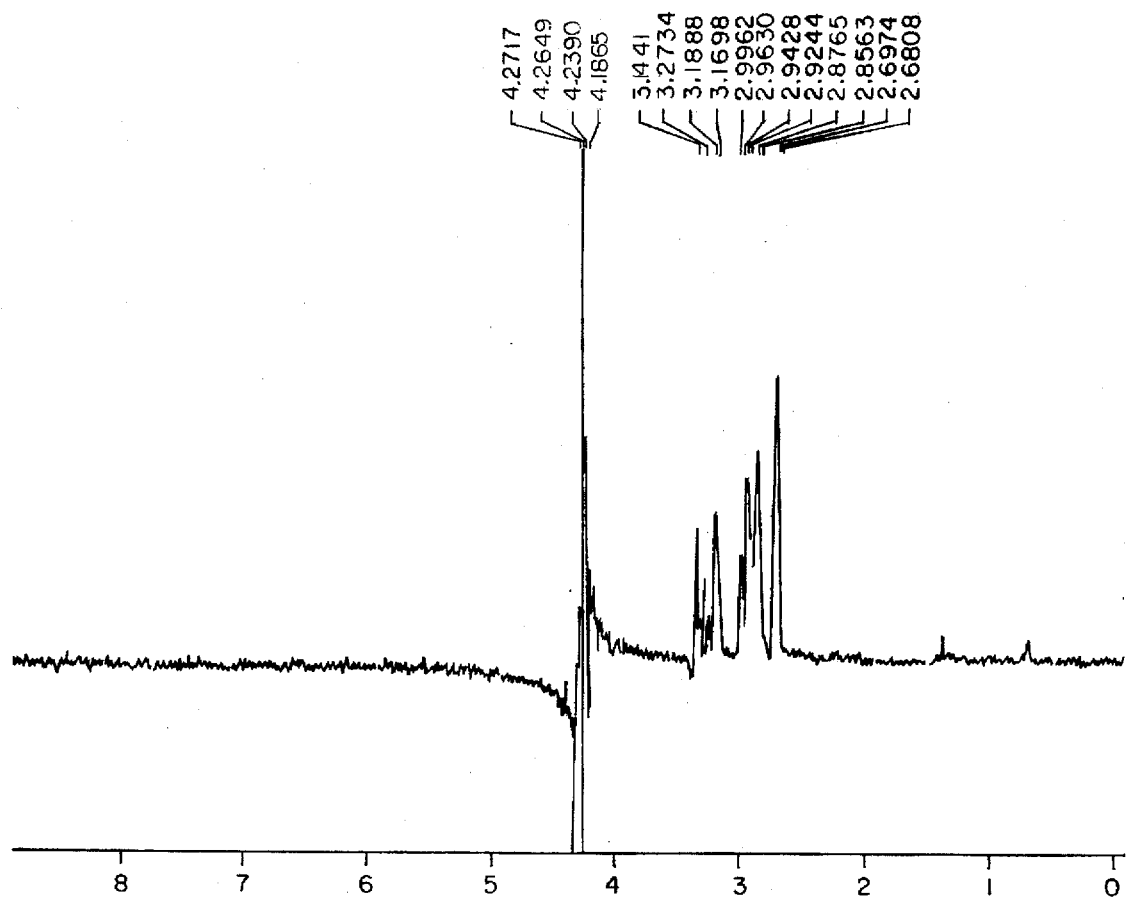
FIG. 3 shows a water suppressed high-field proton NMR spectrum of glucose in water

FIG. 3 shows the NMR spectrum of an aqueous solution of glucose, 1.0 mg/ml, obtained on the AMX 500 MHz spectrometer. Note that the water resonance was suppressed using a P11 echo as described by Bax and Sklenar, *J. Mag. Res.*, 74, 469, 1987.

Figure 4:
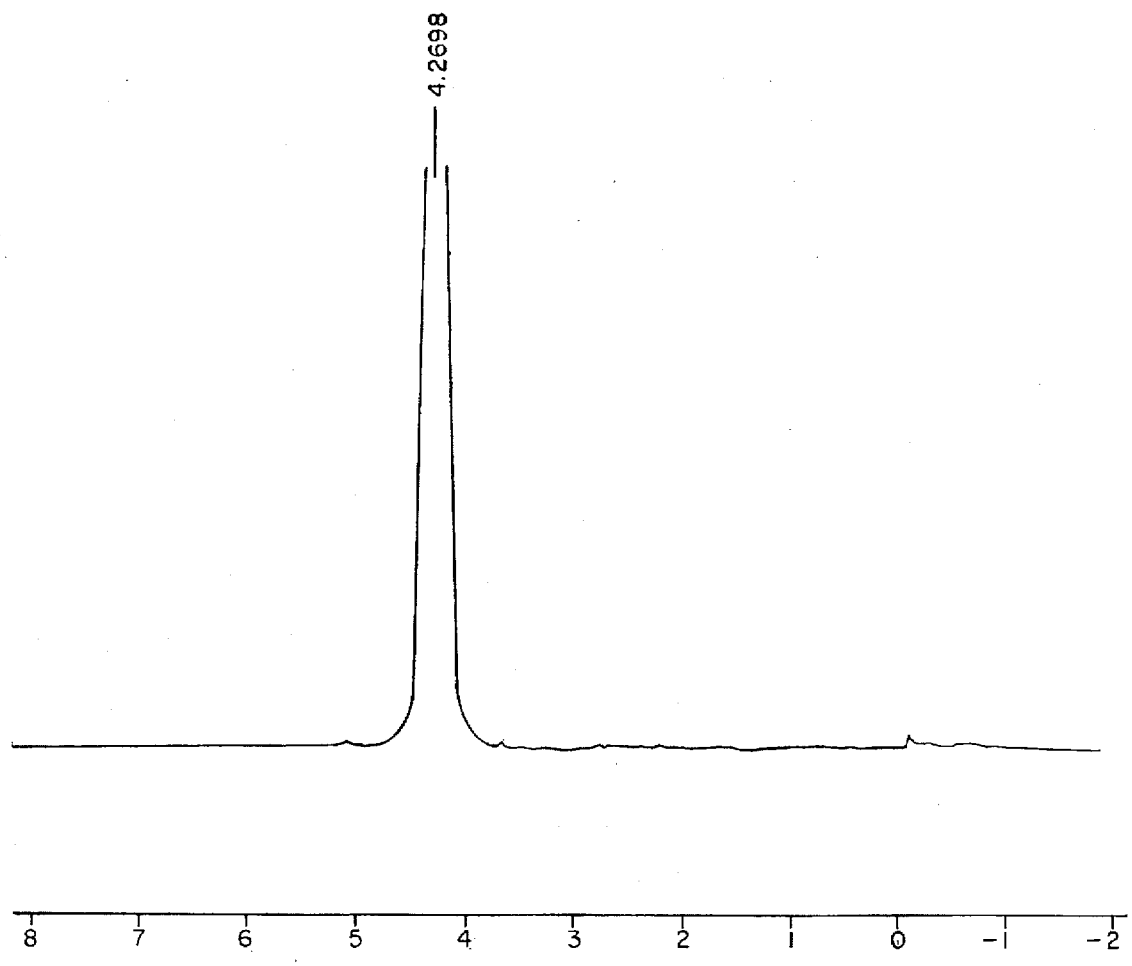
FIG. 4 shows a high-field proton NMR spectrum of whole blood.

Next, whole unlysed blood was analyzed on the same instrument without water suppression. The resulting spectrum is shown in FIG. 4. As expected, there is a very large resonance at 4.2698 ppm due to water. In the region between 3 to 4 ppm and at circa 5.2 ppm, there are much smaller peaks due to glucose. Further upfield at circa 0.8 ppm, there is a resonance peak due to aliphatic protons.

It will be noted that there is not an exact correspondence in chemical shift for the spectra collected in $D_2O$ using TMS as a reference and for the spectra of the aqueous solutions and the blood and tissue in which TMS was not used. However, the peaks in the tissue spectra may still be precisely located without the use of TMS.

Figure 5:
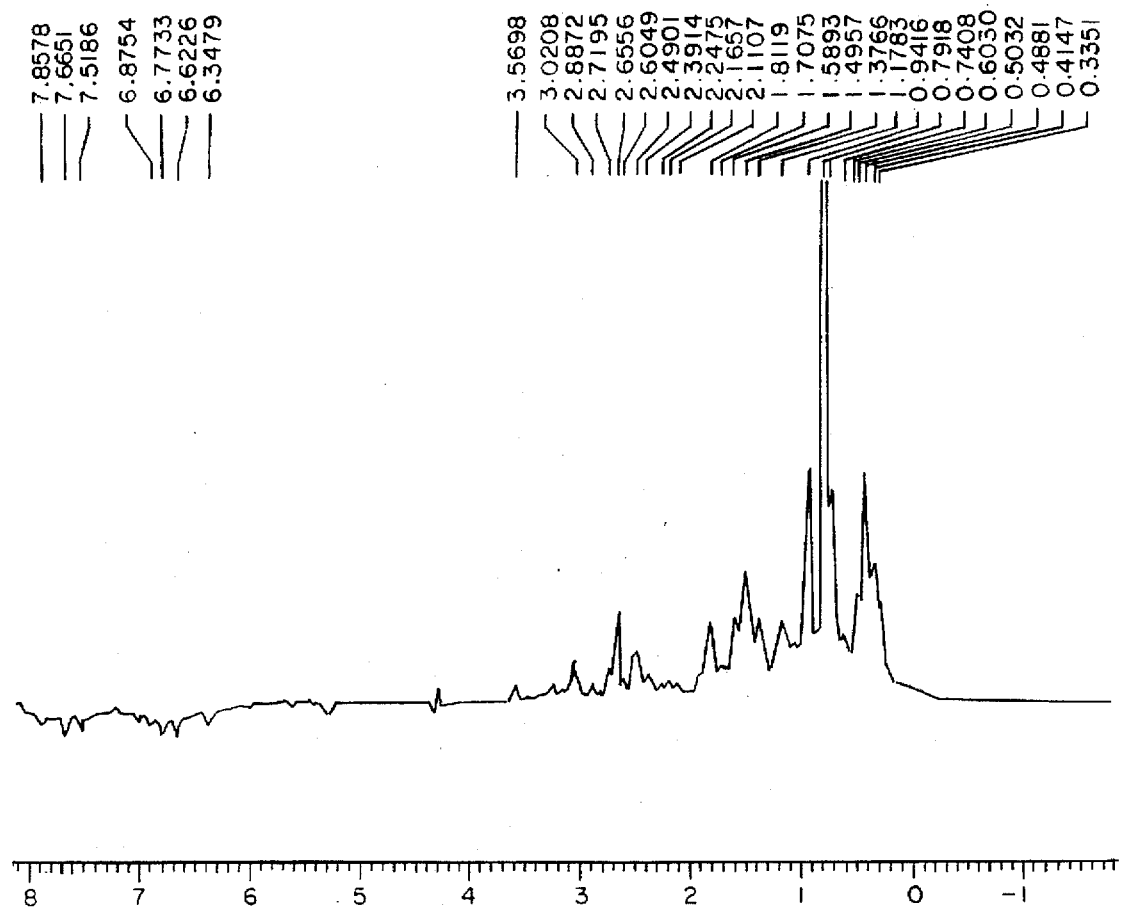
FIG. 5 shows a water suppressed high-field proton NMR spectrum of whole blood.

FIG. 5 shows the spectrum of the same whole blood shown in FIG. 4, however, in this case, water suppression was employed. This spectrum was obtained under non-spin, unlocked conditions and using the water resonance as a chemical shift reference. Resonances due to glucose occur in the range from 2.5 to 3.5 ppm while aliphatic proton resonances occur in the range from 0.5 to 1.5 ppm. Note the resemblance of the resonances clustered around 3 ppm seen in the aqueous glucose solution (FIG. 3) to the resonances clustered around 3 ppm seen in the spectrum of whole blood (FIG. 5). Again, one should not expect an exact correspondence of chemical shift in comparing spectra collected in $D_2O$ using TMS as a reference (FIGS. 1 and 2) to spectra of tissue which use the water resonance as a reference (FIGS. 3 through 6).

Figure 6:
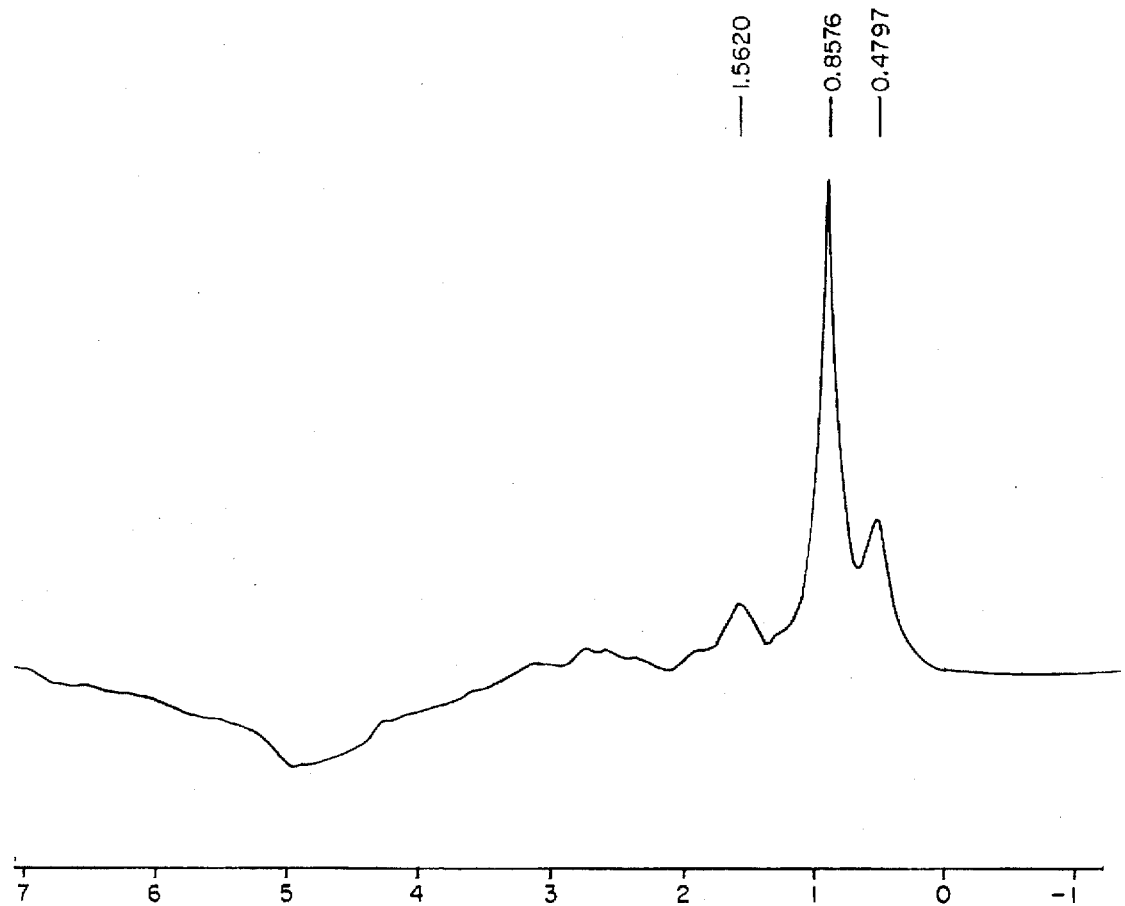
FIG. 6 shows a high-field proton NMR spectrum of cadaveric pulmonary tissue
Figure 7A:
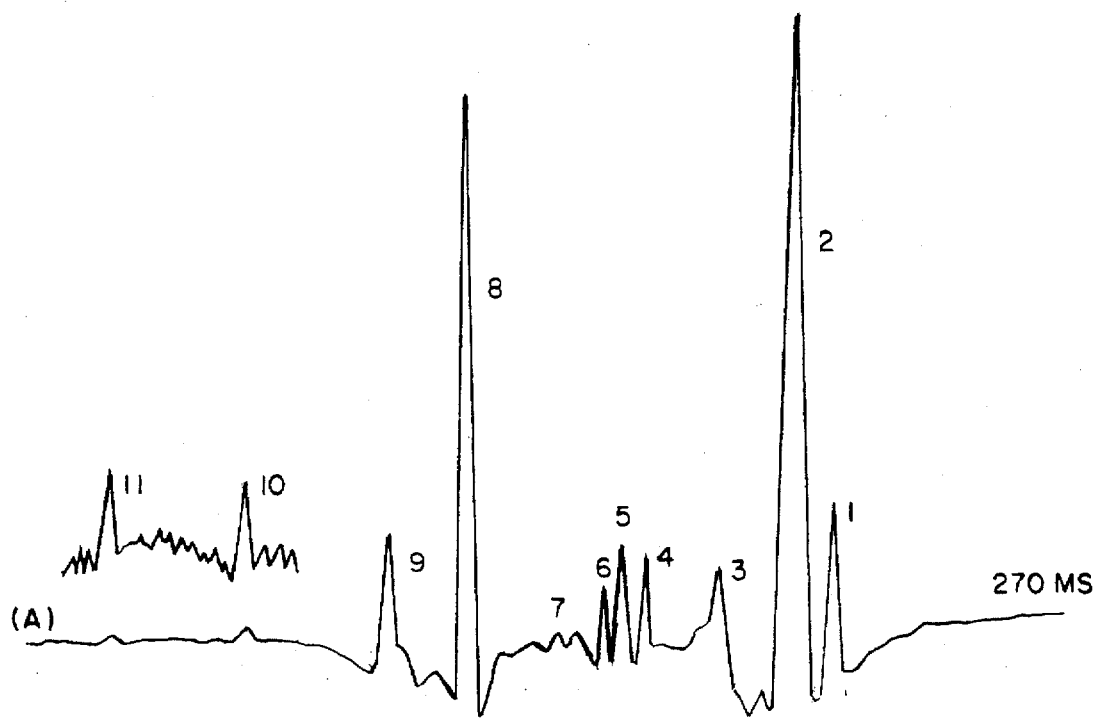
FIG. 7 shows two 1H spectra of rat leg in-vivo using the CPMG spin-echo sequences of duration 270 msec and 540 msec obtained by S. R. Williams et. al. (cited above). The resonance labelled 8, which is that due to water, is attenuated because of the CPMG pulsing sequence.
Figure 7B:
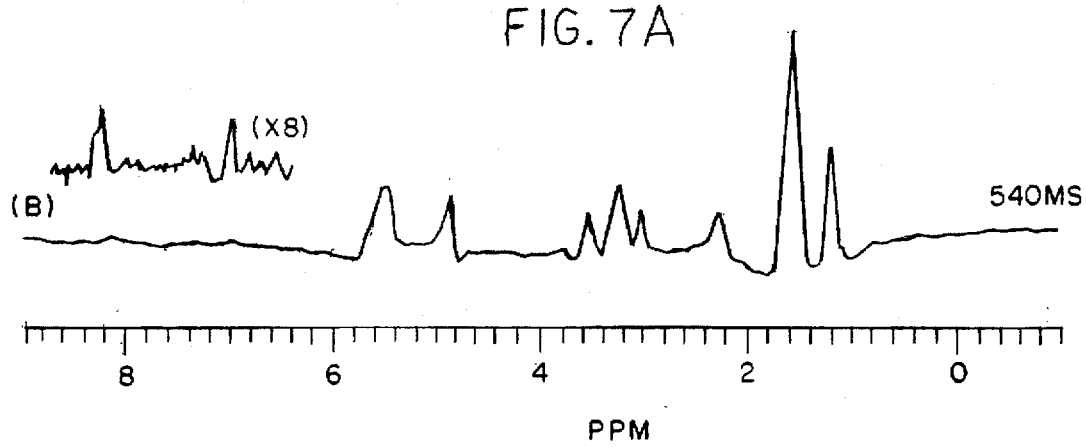
Figure 8:
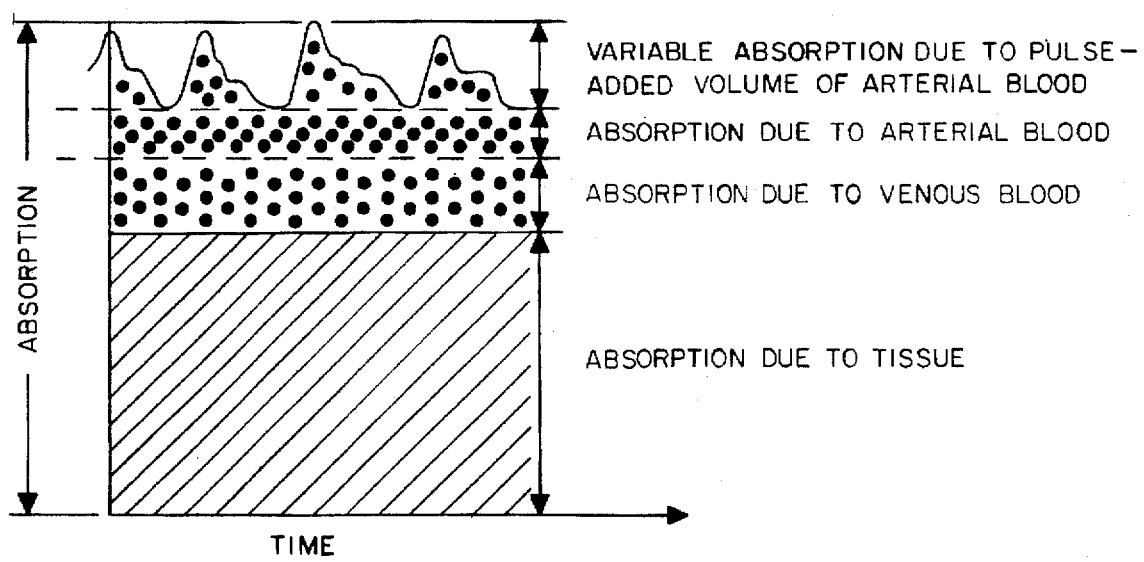
FIG. 8 shows the pulsation phenomenon in tissue which is useful in pulse oximetry. (Taken from M. W. Wukitsch, M. T. Petterson, D. R. Tobler and J. A. Pologe, *Journal of Clinical Monitoring*, vol. 4, 1988, pp. 290–301.)

Finally, FIG. 6 shows a water suppressed spectrum of cadaveric pulmonary tissue which was obtained on the AMX 500. Note the broadened peak at 3 ppm which occurs in the same region as the peaks in the aqueous glucose spectrum. There are also peaks in the range of 1.5 to 2.5 ppm which occur in the same region as cholesterol resonances seen in the spectrum of pure cholesterol, FIG. 2.

These studies suggest that glucose and cholesterol concentration may be measured in tissue using NMR spectroscopy. While the peaks in the spectra of tissue are much broader than those seen in the spectra of compounds dissolved in liquid, there should, nevertheless, be a correspondence of ratios of areas under these peaks to concentration. In fact, using a similar strategy, J. Shapiro and L. Chan have determined concentrations of phosphorus metabolites in-vivo using the proton concentration as an internal standard (*J. of Mag. Res.*, 75, 125, 1987).

Specifically, in the direct measurement of glucose in tissue, the concentration is ascertained by forming a ratio of the arm under the glucose resonances in the range from 3 to 4 ppm divided by the area under the water resonance at 5 ppm. Alternatively, in the indirect measurement of glucose in tissue, the area under the aliphatic proton resonance in the range from 1 to 1.5 ppm is compared to the area of the water resonance at 5 ppm. Next, using water suppression, the area of the smaller glucose resonance is compared to the aliphatic proton resonance in the range from 1 to 1.5 ppm. In this fashion, using the high-field aliphatic resonance in the range from 1 to 1.5 ppm as a "bridge", the glucose and water resonances may be compared to each other. Cholesterol may be measured using the same direct or indirect strategy and using the cholesterol resonance at 2 ppm.

In the in-vivo experiment, the use of TMS as a reference is unlikely. The large water resonance at 5 ppm serves as a reference point in conjunction with the high-field aliphatic proton reference in the range from 1 to 1.5 ppm. Given constant magnetic field strength, the glucose, cholesterol or other desired analyte resonances can be located by measuring the relative distance from these two points.

It should be clearly understood that the forms of the present invention herein described are illustrative only and are not intended to limit the scope of the invention.

I claim:

1. A method for determining in-vivo the concentration of an analyte, said method comprising the steps of:
   a. obtaining an NMR spectrum of capillary bed tissue in the in-vivo setting at a plurality of resonances, said plurality including at least one analyte resonance and at least one reference resonance;
   b. forming a ratio by dividing the area of the analyte resonance by the area of the reference resonance in said NMR spectrum; and
   c. correlating said ratio to reference data to determine the concentration of the analyte.

2. The method of claim 1, wherein said step of obtaining an NMR spectrum is determined in linkage with the pulsation of blood.

3. The method of claim 2, wherein said step determined in linkage with the pulsation of blood further comprises the steps of isolating an NMR spectrum due to arterial blood by:
   a. obtaining an NMR spectrum at said plurality of resonances, from capillary bed tissue during the peak of blood pulsation through the tissue;
   b. obtaining an NMR spectrum at said plurality of resonances from said capillary bed tissue during the trough of a blood pulsation through the tissue;
   c. subtracting said NMR spectrum obtained at said trough of blood pulsation from said NMR spectrum obtained at said peak of blood pulsation to determine the NMR spectrum for the arterial blood; and
   d. wherein the step of correlating the ratio of said resonances further comprises: comparing the NMR spectrum due to arterial blood to said reference data.

4. The method of claim 1, wherein the analyte resonance is selected from the group consisting of: glucose, cholesterol, urea, pH, sodium and magnesium.

5. The method of claim 1, wherein said step of obtaining an NMR spectrum further comprises the step of utilizing a slice selection gradient to localize the tissue to be analyzed.

6. The method of claim 5, wherein said slice selection gradient is generated by a magnetic resonance imager.

7. The method of claim 5, wherein said slice selection gradient analyzes the tissue selected from the group consisting of: the inferior vena cava, the aorta, the heart chambers, the neck veins, the lungs and capillary bed tissue of a finger.

8. The method of claim 1, wherein the reference resonance is a water resonance.

9. The method of claim 8, wherein the concentration of said analyte is directly measured by utilizing said ratio formed by dividing the area of the analyte resonance by the area of the reference resonance.

10. The method of claim 8, wherein the concentration of said analyte is indirectly measured following the steps of:
    a. obtaining an NMR spectrum at an aliphatic proton resonance;
    b. comparing the area under the aliphatic proton resonance to the area of the reference resonance; and
    c. utilizing the aliphatic proton resonance to define a bridge for comparing the analyte and reference resonances to each other.

11. A method for determining the concentration of an analyte in a blood sample, said method comprising the steps of:
    a. obtaining an NMR spectrum at a plurality of resonances from the blood sample, said plurality of resonances including at least on analyte resonance and at least one reference resonance;
    b. forming a ratio by dividing the area of the analyte resonance by the area of the reference resonance in said NMR spectrum; and
    c. correlating the ratio of these resonances with reference data to determine the concentration of the analyte.

12. The method of claim 11, wherein the blood sample is whole blood.

13. The method of claim 11, wherein a single blood sample is analyzed concurrently for multiple analytes.

14. The method of claim 11, wherein the reference resonance is a water resonance.

15. The method of claim 11, wherein the analyte resonance is selected from the group consisting of: glucose, cholesterol, urea, pH, sodium and magnesium.

* * * * *